United States Patent
Yoo et al.

(10) Patent No.: US 8,675,404 B2
(45) Date of Patent: Mar. 18, 2014

(54) READING METHOD OF NON-VOLATILE MEMORY DEVICE

(75) Inventors: Hyun-Seung Yoo, Gyeonggi-do (KR);
Sung-Joo Hong, Gyeonggi-do (KR);
Seiichi Aritome, Gyeonggi-do (KR);
Seok-Kiu Lee, Gyeonggi-do (KR);
Sung-Kye Park, Gyeonggi-do (KR);
Gyu-Seog Cho, Gyeonggi-do (KR);
Eun-Seok Choi, Gyeonggi-do (KR);
Han-Soo Joo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 13/475,204

(22) Filed: May 18, 2012

(65) Prior Publication Data
US 2013/0128660 A1 May 23, 2013

(30) Foreign Application Priority Data
Nov. 23, 2011 (KR) .......................... 10-2011-0122937

(51) Int. Cl.
*G11C 16/00* (2006.01)
(52) U.S. Cl.
USPC ............. 365/185.02; 365/185.17; 365/185.18
(58) Field of Classification Search
USPC ......................................... 365/185.02, 185.1
See application file for complete search history.

(56) References Cited

U.S. PATENT DOCUMENTS

| 7,009,881 B2 * | 3/2006 | Noguchi ................... 365/185.17 |
| 7,916,547 B2 * | 3/2011 | Hosono .................... 365/185.21 |
| 7,965,555 B2 * | 6/2011 | Namiki et al. ........... 365/185.17 |

FOREIGN PATENT DOCUMENTS

KR    1020120076298    7/2012

OTHER PUBLICATIONS

"New read scheme of variable Vpass-read for Dual Control gate with Surrounding Floating gate (DC-SF) NAND flash cell"—HyunSeung Yoo, et al.
IEEE 3rd International Memeory Workshop, May 22-25, 2011, presented on May 24, 2011 and published on Nov. 24, 2011.

* cited by examiner

*Primary Examiner* — Tan T. Nguyen
(74) *Attorney, Agent, or Firm* — IP & T Group LLP

(57) ABSTRACT

A reading method of a non-volatile memory device that includes a plurality memory cells that each include one floating gate and two control gates disposed adjacent to the floating gate on two alternate sides of the floating gate, respectively, and two adjacent memory cells share one control gate, the reading method comprising applying a read voltage to control gates of a selected memory cell, applying a second pass voltage to alternate control gates of the memory cells different from the control gates of the selected memory cells starting from the control gates next to the selected memory cell, and applying a first pass voltage that is lower than the second pass voltage to alternate the control gates of the memory cells different from the control gates of the selected memory cells starting from the control gates secondly next to the selected memory cell.

20 Claims, 20 Drawing Sheets

READING METHOD OF NON-VOLATILE MEMORY DEVICE

CROSS-REFERENCE TO RELATED APPLICATIONS

The present application claims priority of Korean Patent Application No. 10-2011-0122937, filed on Nov. 23, 2011, which is incorporated herein by reference in its entirety.

BACKGROUND

1. Field

Exemplary embodiments of the present invention relate to semiconductor design technology, and more particularly, to a reading method of a non-volatile memory device.

2. Description of the Related Art

A nonvolatile memory device retains stored data even when power is interrupted. Each memory cell of a non-volatile memory device includes a floating gate that is controlled by a control gate. Also, each memory cell writes or erases data by accumulating or discharging electrons to or from the floating gate.

FIG. 1 is a circuit diagram of a conventional non-volatile memory device. In particular, each memory cell includes one floating gate and two control gates disposed adjacent to the floating gate.

Referring to FIG. 1, the conventional non-volatile memory device includes a plurality of strings, a plurality of bit lines BL, and a plurality of source lines SL. Each bit lines BL is coupled with a first end of each string, and the source line SL is coupled in common with a second end of each string. Each string includes a drain selection transistor DST, a plurality of memory cells MC0 to MC3, and a source selection transistor SST.

A gate of the drain selection transistor DST extends in a first direction to form a drain selection line DSL, and a gate of the source selection transistor SST extends in the first direction to form a source selection line SSL.

Each of the memory cells MC0 to MC3 includes one floating gate FG and two control gates CG disposed adjacent to the floating gate FG. For example, the memory cell MC0 includes the floating gate FG0 and the control gates CG0 and CG1 disposed on both sides of the floating gate FG0. The control gates extend in the first direction to form word lines WL.

The conventional non-volatile memory device may increase the coupling ratio of a floating gate and control gates.

However, since the conventional non-volatile memory device has a structure where adjacent memory cells share one control gate, when a program voltage or a read voltage is applied to the two control gates included in a selected memory cell to perform a program operation or a read operation, the memory cells adjacent to the selected memory cell are affected. For example, when a program operation is performed and a program voltage is applied to the two control gates of a selected memory cell, the program voltage is applied to a control gate of the selected memory cell and the control gates of unselected memory cells adjacent to the selected memory cell. Therefore, adjacent memory cells may be programmed, which may be referred to as a program disturbance. However, the features that may be caused during a read operation are not known.

SUMMARY

An embodiment of the present invention is directed to a reading method of a non-volatile memory device having a structure where adjacent memory cells share a control gate.

In accordance with an embodiment of the present invention, a reading method of a non-volatile memory device that includes a plurality memory cells that each include one floating gate and two control gates disposed adjacent to the floating gate on two alternate sides of the floating gate, respectively, and two adjacent memory cells share one control gate, the reading method comprising: applying a read voltage to control gates of a selected memory cell; applying a second pass voltage to alternate control gates of the memory cells different from the control gates of the selected memory cells starting from the control gates next to the selected memory cell; and applying a first pass voltage that is lower than the second pass voltage to alternate the control gates of the memory cells different from the control gates of the selected memory cells starting from the control gates secondly next to the selected memory cell.

In accordance with another embodiment of the present invention, a reading method of a non-volatile memory device that includes a plurality of memory cells that each include one floating gate and two control gates disposed adjacent to the floating gate on two alternate sides of the floating gate, respectively, and two adjacent memory cells share one control gate, the reading method comprising: applying a read voltage to control gates of a selected memory cell; applying a second pass voltage to a control gate disposed adjacent to the control gates of the selected memory cell; and applying a first pass voltage that is lower than the second pass voltage to the control gates that do not apply the second pass voltage.

DETAILED DESCRIPTION

Figure 1:
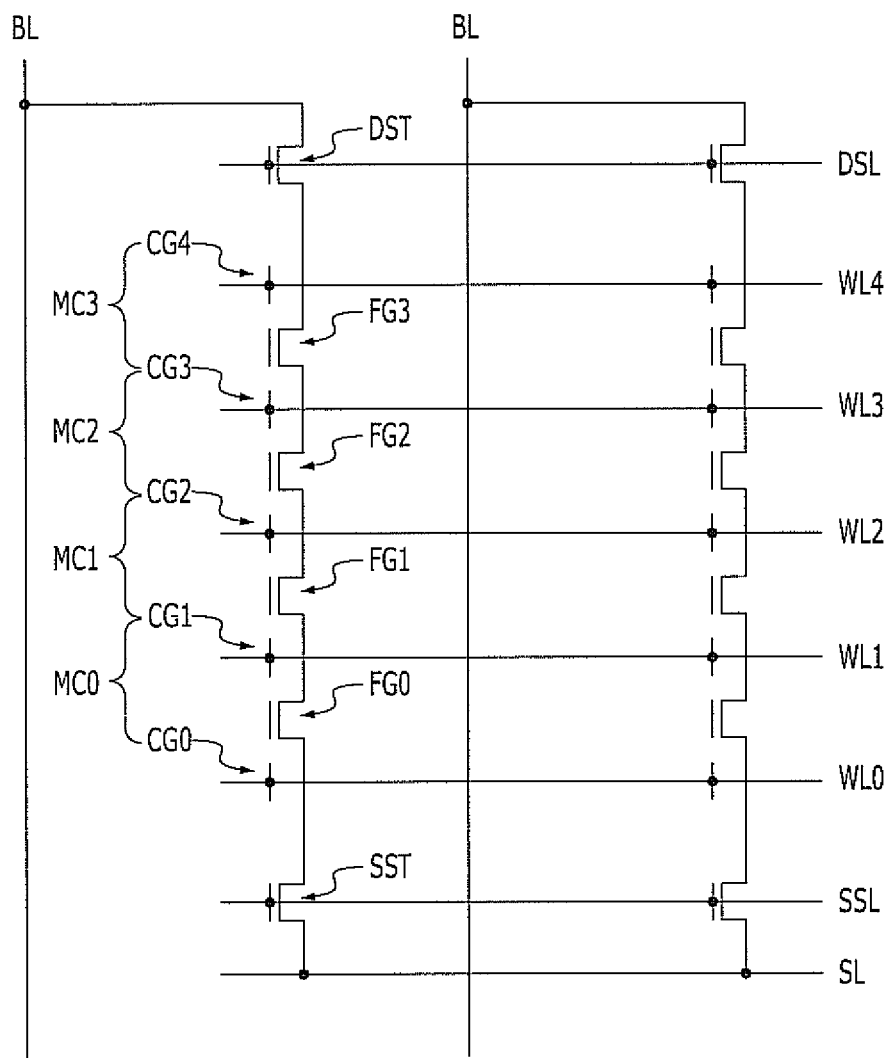
FIG. 1 is a circuit diagram of a conventional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention discloses a reading method of a non-volatile memory device including one floating gate and two control gates disposed adjacent to the floating gate. This structure may be realized in both two-dimensional non-volatile memory device, which includes a plurality of memory cells arrayed in a single layer over a semiconductor substrate, and three-dimensional non-volatile memory device, which includes a plurality of memory cells arrayed perpendicularly to a substrate. Hereafter, the exemplary structures of non-volatile memory devices to which the reading method in accordance with an embodiment of the present invention are described first, and the reading method in accordance with an embodiment of the present invention subsequently is described.

Figure 2A:
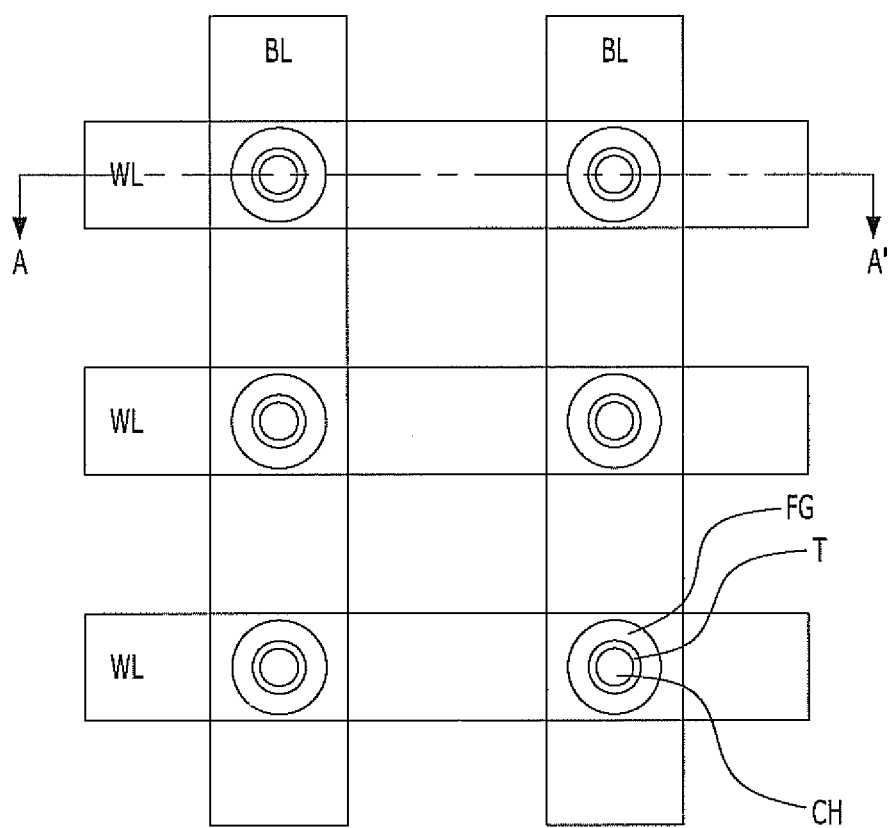
FIGS. 2A to 2D illustrate a first exemplary structure of a non-volatile memory device.
Figure 2B:
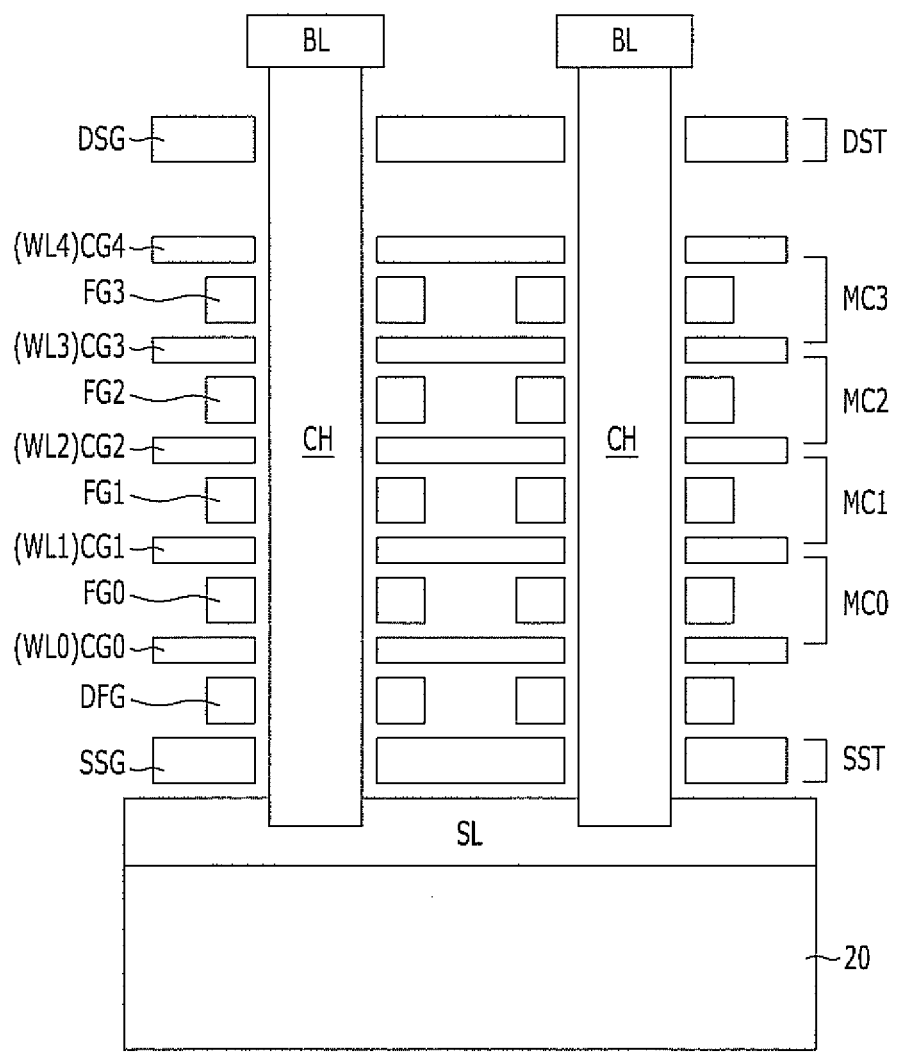
Figure 2C:
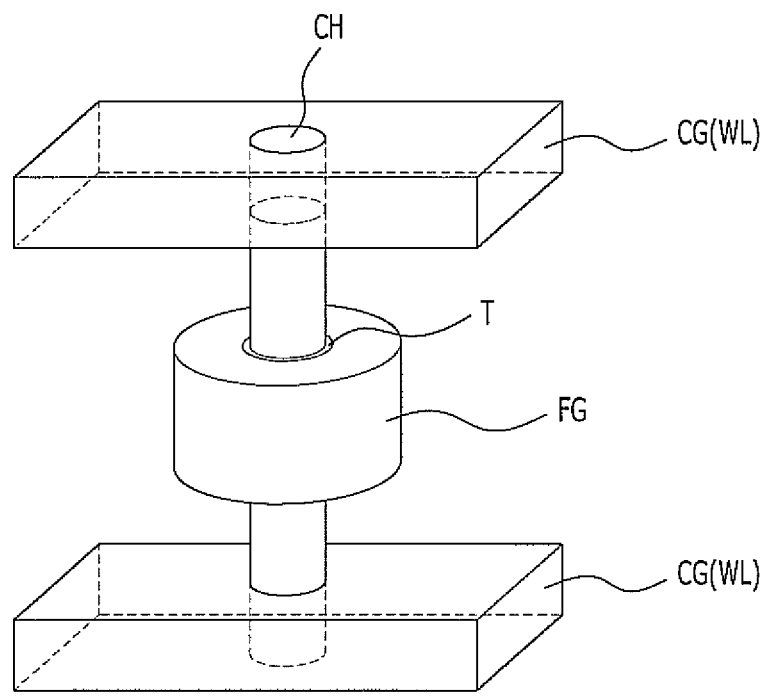
Figure 2D:
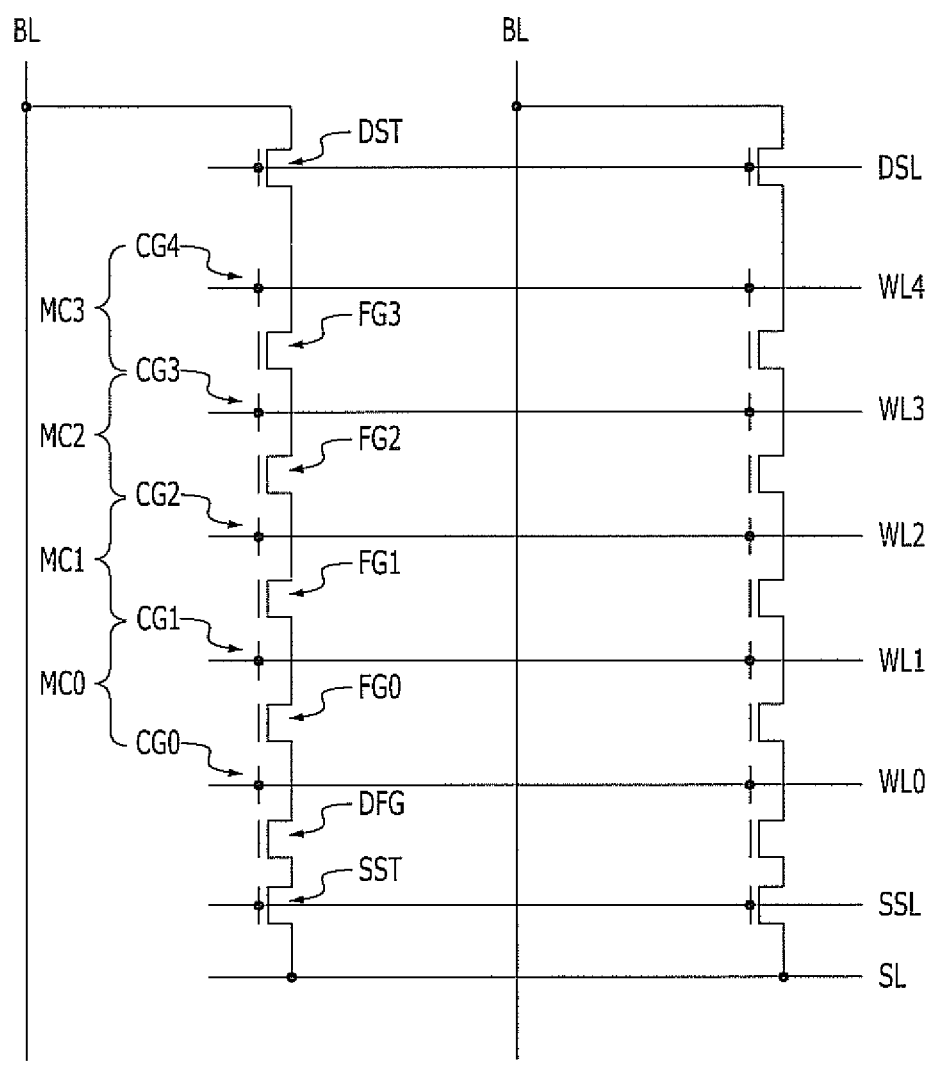

FIGS. 2A to 2D illustrate a first exemplary structure of a non-volatile memory device. FIG. 2A is a plan view of the non-volatile memory device, and FIG. 2B is a cross-sectional view of the non-volatile memory device taken along a line A-A'. FIG. 2C is a perspective view of a unit memory cell shown in FIGS. 2A and 2B, and FIG. 2D is an equivalent circuit diagram of the unit memory cell shown in FIG. 2B.

Referring to FIGS. 2A to 2D, the first exemplary structure of the non-volatile memory device includes a plurality of channels CH, a plurality of floating gates FG, and a plurality of control gates CG. The plurality of channels CH are formed over a substrate 20 and extend perpendicularly to the substrate 20. The substrate 20 may include a source line SL. The plurality of floating gates FG and the plurality of control gates CG are alternately stacked along the channels CH. For example, the floating gates FG may have a ring shape surrounding a channel CH, and the control gates CG extend in a first direction while surrounding the channels CH to form word lines WL.

One floating gate FG, e.g., floating gate FG0, that contacts one channel CH and two control gates CG, e.g., control gates CG0 and CG1, disposed adjacent to the floating gate FG0 above and below the floating gate FG0 constitute one unit memory cell MC, e.g., a memory cell MC0. In addition, adjacent memory cells, e.g. memory cell MC0 and MC1, share one control gate, e.g., control gate CG1, between two adjacent memory cells. In other words, two neighboring memory cells MC, e.g., memory cells MC0 and MC1, share one control gate CG, e.g., control gate CG1.

A tunnel insulation layer T for tunneling of charges is interposed between a floating gate FG and a channel CH. Also, a charge blocking layer (not shown) is interposed between a floating gate FG and a channel CH to block the transfer of charges. Furthermore, a gate insulation layer is interposed between a control gate CG and a channel CH. According to the process for fabricating the present non-volatile memory device, the tunnel insulation layer T or the charge blocking layer (not shown) may function as a gate insulation layer.

The channels CH may be arrayed in the form of a matrix in a first direction, e.g., the cross-sectional direction shown in the drawing along line A-A', and a second direction crossing the first direction. The lower portions of the channels CH contact the source line SL in common. Also, the upper portions of the channels CH contact bit lines BL, which are disposed over the upper portions of the channels CH and extend the second direction.

Drain selection transistors DST are disposed on the upper portions of the memory cells MC0 to MC3, and source selection transistors SST are disposed on the upper portions of the memory cells MC0 to MC3. To this end, a gate insulation layer (not shown) is disposed above the memory cells MC0 to MC3 to form drain selection gates DSG surrounding the channels CH, and the drain selection gates DSG extend in the first direction to form a drain selection line DSL. Also, a gate insulation layer (not shown) is disposed below the memory cells MC0 to MC3 to form source selection gates SSG surrounding the channels CH, and the source selection gates SSG extends in the first direction to form a source selection line SSL.

A string includes one channel CH, the source selection transistor SST, the memory cells MC0 to MC3, and the drain selection transistor DST. The drain selection transistor DST controls the electrical coupling between a bit line BL and the string according to a voltage applied to the drain selection gate DSG, and the source selection transistor SST controls the electrical coupling between the source line SL and the string according to a voltage applied to the source selection gate SSG.

In addition, a reference symbol DFG shown in FIG. 2D is a dummy floating gate DFG, which does not substantially take a part of a memory cell and function as a floating gate. The dummy floating gate DFG may be omitted or further included between the drain selection gate DSG and the uppermost control gate CG. Since the dummy floating gate DFG is an additional constituent element in the process for fabricating the non-volatile memory device in accordance with the embodiment of the present invention, further description will be omitted.

The first exemplary structure of the non-volatile memory device, which is described above, is a three-dimensional structure where the multiple memory cells are stacked vertically over the substrate and one unit memory cell includes one floating gate and two control gates disposed adjacent to the floating gate. As aforementioned, the reading method of the present invention may be applied to the non-volatile memory device.

Figure 3A:
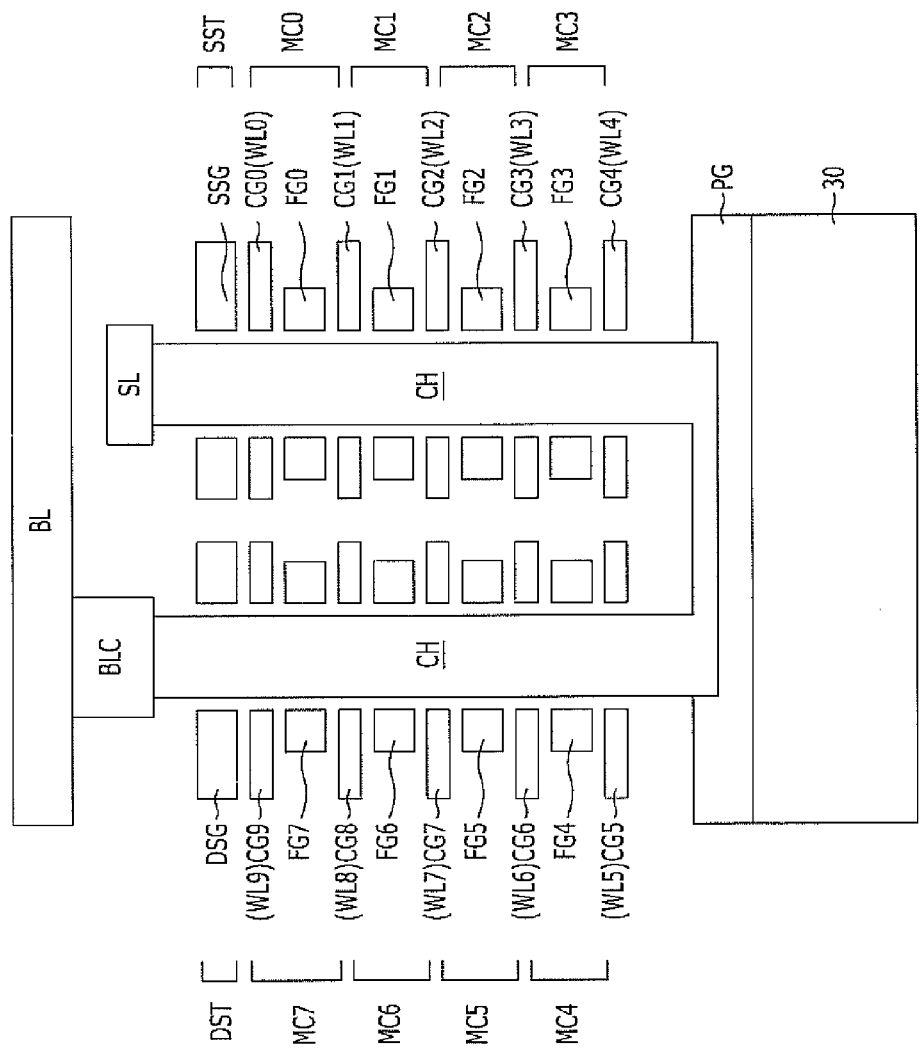
FIGS. 3A and 3B illustrate a second exemplary structure of a non-volatile memory device.
Figure 3B:
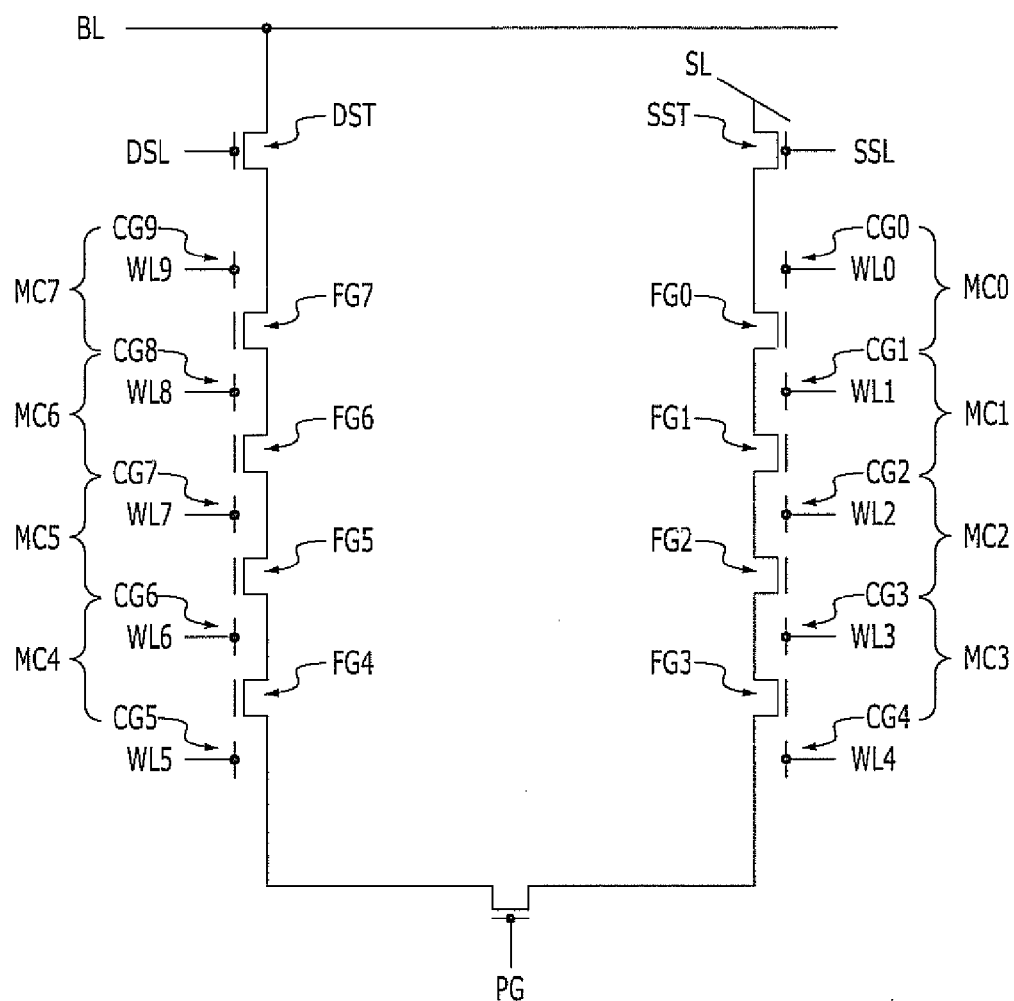

FIGS. 3A and 3B illustrate a second exemplary structure of a non-volatile memory device. FIG. 3A is a cross-sectional view of the non-volatile memory device, and FIG. 3B is a circuit diagram illustrating an equivalent circuit of FIG. 3A. Description of similar parts in the first exemplary structure of the non-volatile memory device is omitted, and the description is focuses on the differences from the first exemplary structure of the non-volatile memory device.

Referring to FIGS. 3A and 3B, the second exemplary structure of the non-volatile memory device includes U-shaped channels CH that are formed over a substrate 30. In the second exemplary structure, the U-shaped channels CH include a pair of pillars that extend perpendicularly to the substrate 30 and a connection portion for coupling the lower portions of the pillars. The connection portion is controlled by a pipe gate PG that is disposed over the substrate 30 and surrounds the sidewalls and the bottom surface of the connection portion. A gate insulation layer (not shown) may be interposed between the pipe gate PG and the connection portion.

A plurality of floating gates FG and a plurality of control gates CG may be alternately stacked along the pair of pillars of the channel CH. In the second exemplary structure, the floating gates FG have a ring shape surrounding a channel, and the control gates CG extend in a first direction, which is a direction crossing the cross-sectional direction shown in the FIG. 3A, and surround each pillar of the channel CH to form word lines WL. One unit memory cell MC, e.g., a memory cell MC0, is includes one floating gate FG, e.g., a floating gate FG0, contacting one channel CH and two control gates FG, e.g., control gates CG0 and CG1, disposed adjacent to the floating gate FG0 above and below the floating gate FG0 in substantially the same as that of the first exemplar structure. The structures of a tunnel insulation layer T, a charge blocking layer (not shown), and a gate insulation layer are also substantially the same as that of the first exemplary structure.

The upper end of a first pillar of the pair of pillars of the channel CH contacts a bit line BL that extends in a second direction, which is the cross-sectional direction shown in FIG. 3A, and the upper end of a second pillar of the pair of pillars of the channel CH contacts a source line SL that extends in the first direction. Since the extending directions of the bit line BL and the source line SL are different from each other, the bit line BL and the source line SL may be disposed in different layers. For example, the bit line BL may be disposed above the source line SL, and as a result, the bit line BL is coupled with the upper end of the first pillar of the pair of pillars of the channel CH by a bit line contact BLC interposed between them.

A drain selection transistor DST and a source selection transistor SST are respectively disposed above the uppermost memory cell MC7 of the first pillar and the upper portion of the uppermost memory cell MC0 of the second pillar. To this end, a drain selection gate DSG surrounding the channel CH is disposed above the uppermost memory cell MC7 with a gate insulation layer (not shown) interposed between them. The drain selection gate DSG extends in the second direction to form a drain selection line DSL. Also, a source selection gate SSG surrounding the channel CH is disposed above the memory cell MC0 with a gate insulation layer (not shown) interposed between them. The source selection gate SSG extends in the first direction to form a source selection line SSL.

One U-shaped string includes one channel CH, a source selection transistor SST, a plurality of memory cells MC0 to MC7, and a drain selection transistor DST. In the second exemplary structure, the coupling between the memory cells MC4 to MC7 formed along the first pillar and the memory cells MC0 to MC3 formed along the second pillar may be controlled in response to a voltage applied to a pipe gate PG. The drain selection transistor DST controls the electrical coupling between the bit line BL and the string in response to a voltage applied to the drain selection gate DSG. The source selection transistor SST controls the electrical coupling between source line SL and the string in response to a voltage applied to the source selection gate SSG.

The second exemplary structure of the non-volatile memory device, which is described above, is a three-dimensional structure where multiple memory cells are stacked vertically over the substrate and where one unit memory cell includes one floating gate and two control gates disposed adjacent to the floating gate, just as in the first exemplary structure. Furthermore, since the number of memory cells included in one string is greater than that in the first exemplary structure, the non-volatile memory device according to the second exemplary structure may have an increased integration degree. As aforementioned, the reading method of the present invention may be applied to the non-volatile memory device according to the second exemplary structure.

Figure 4A:
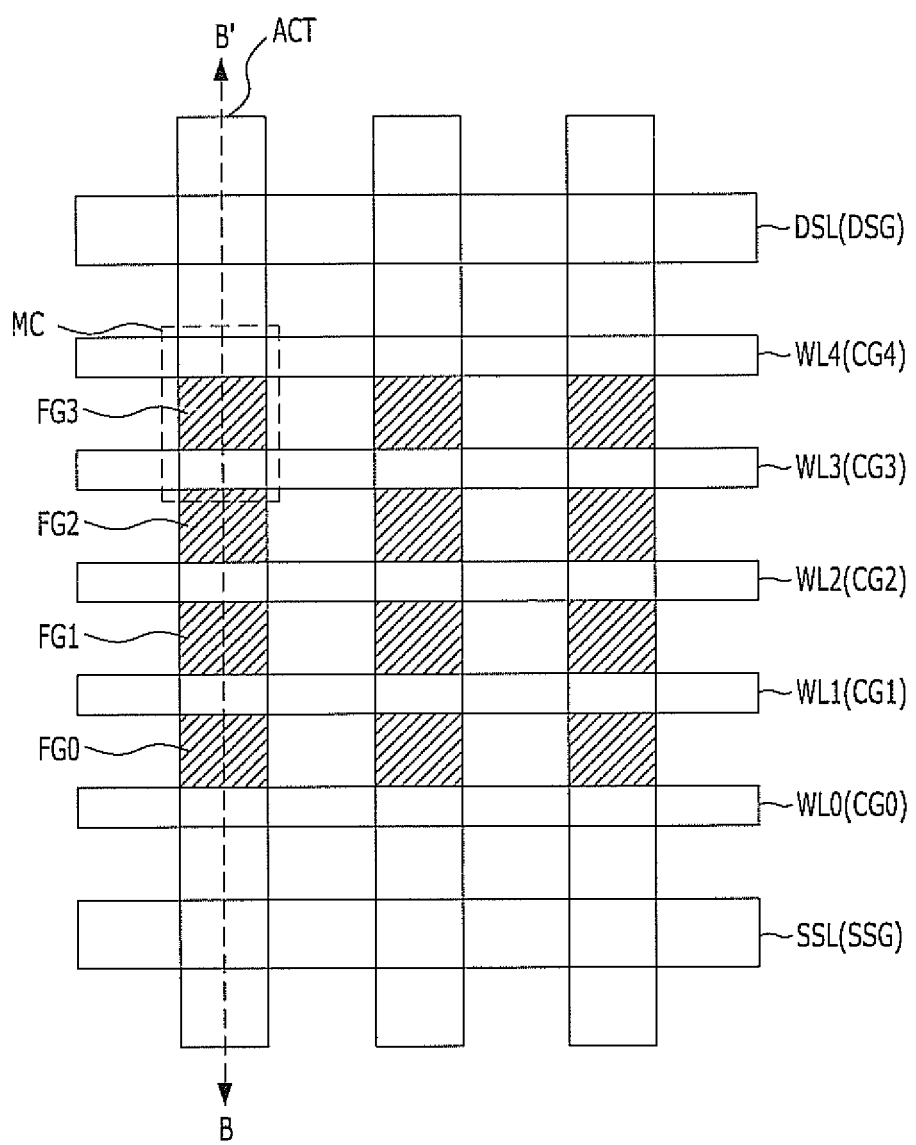
FIGS. 4A and 4B illustrate a third exemplary structure of a non-volatile memory device.
Figure 4B:
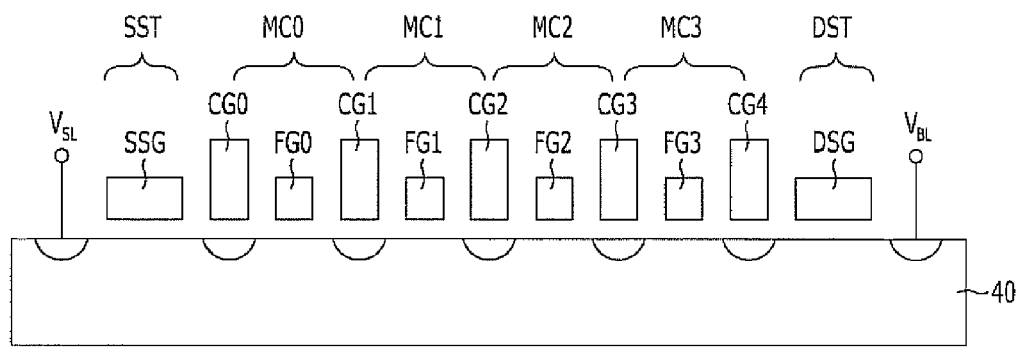

FIGS. 4A and 4B illustrate a third exemplary structure of a non-volatile memory device. FIG. 4A is a plan view of the non-volatile memory device, and FIG. 4B is a cross-sectional view of the non-volatile memory device taken along a line B-B'. Description of similar parts in the above-described first exemplary structure is omitted, and the description of the third exemplary structure focuses on the differences from the first exemplary structure of the non-volatile memory device.

Referring to FIGS. 4A and 4B, the third exemplary structure of the non-volatile memory device includes a drain selection line DSL, a source selection line SSL, a plurality of word lines WL0 to WL4, and a plurality of floating gates FG. that the drain selection line DSL is formed over a semiconductor substrate 40 and extends in a first direction. The plurality of floating gates FG are disposed between the word lines WL. In the third exemplary structure, the drain selection line DSL, the word lines WL0 to WL4, and the source selection line SSL are formed to extend across a plurality of active regions ACT defined in the semiconductor substrate 40. The floating gates FG are disposed in the active regions ACT alternately between the word lines WL.

In the third exemplary structure, one unit memory cell MC, e.g., a memory cell MC0, includes one floating gate FG, e.g., a floating gate FG0, and two control gates CG, e.g., control gates CG0 and CG1, disposed adjacent to the floating gate FG0. In the third exemplary structure, one control gate CG, e.g., control gates CG1, of any one memory cell MC, e.g., a memory cell MC1, is shared by the adjacent memory cell MC, e.g., memory cells MC0. In other words, the two adjacent memory cells MC, e.g., the memory cells MC0 and MC1, share one control gate CG, e.g., the control gate CG1.

A tunnel insulation layer (not shown) for tunneling of charges is interposed between a floating gate FG and the semiconductor substrate 40. Also, a charge blocking layer (not shown) is interposed between a floating gate FG and a control gate CG to block the transfer of charges. Furthermore, a gate insulation layer (not shown) is interposed between a control gate CG and the semiconductor substrate 40. Also, a gate insulation layer (not shown) is interposed between the source selection gate SSG or the drain selection gate DSG and the semiconductor substrate 40. In addition, although not illustrated in FIG. 4A or 4B, an insulation layer may be buried in the region between the floating gates FG in the first direction.

The active region ACT in a first side of the drain selection line DSL is coupled with a bit line (refer to a reference symbol $V_{BL}$ in FIG. 4B) that extends in a direction through a drain contact (not shown). Also, the active region ACT in a second side of the source selection line SSL is coupled with a source line (refer to a reference symbol $V_{SL}$ in FIG. 4B) that extends in a direction through a source contact (not shown).

A string includes the drain selection transistor DST, the memory cells MC0 to MC3, and the source selection transistor SST. The drain selection transistor DST on the first side of the memory cells MC0 to MC3 controls the electrical coupling between a bit line BL and a string according to a voltage applied to the drain selection gate DSG, and the source selection transistor SST on the second side of the memory cells MC0 to MC3 controls the electrical coupling between the source line SL and a string according to a voltage applied to the source selection gate SSG.

The third exemplary structure of the non-volatile memory device, which is described above, is a three-dimensional structure where multiple memory cells are stacked vertically over the substrate and where one unit memory cell includes one floating gate and two control gates disposed adjacent to the floating gate. As aforementioned, the reading method of the present invention may be applied to the non-volatile memory device according to the third exemplary structure.

The first to third exemplary structures of the non-volatile memory devices all have a structure where adjacent memory cells share one control gate. Described hereafter is a reading method that may detect and address issues which may occur during a read operation that reads data stored in a selected memory cell in the structure.

Figure 5A:
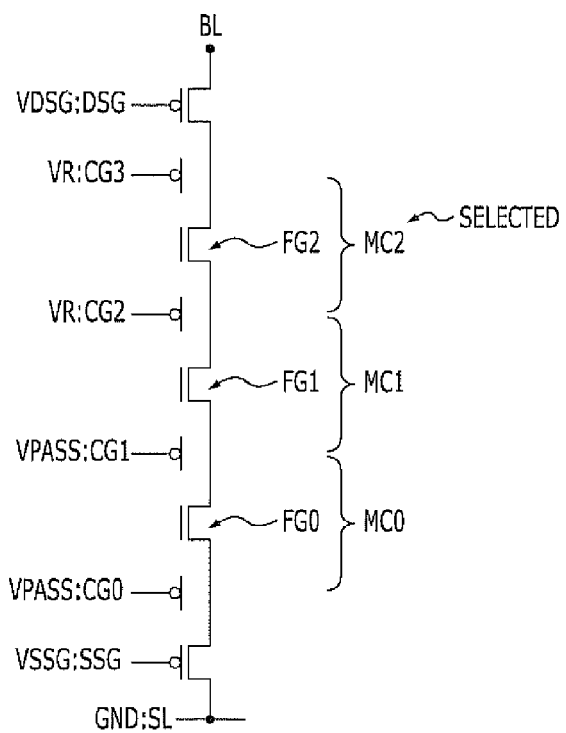
FIGS. 5A to 5H illustrate a conventional read operation.
Figure 5B:
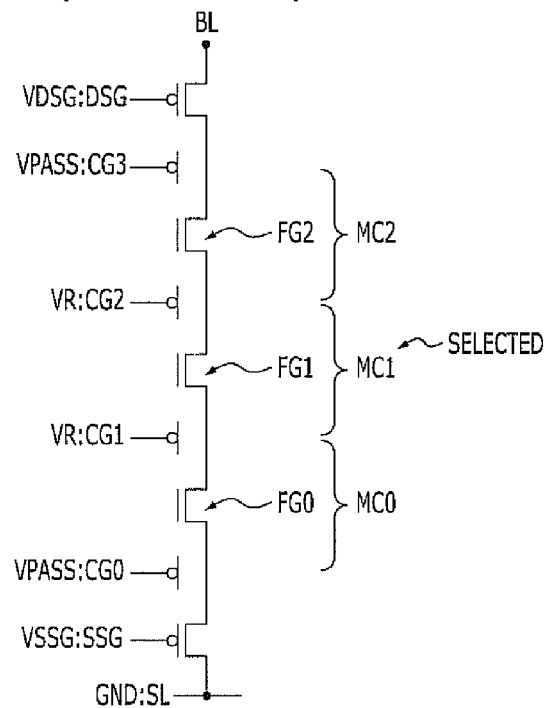
Figure 5C:
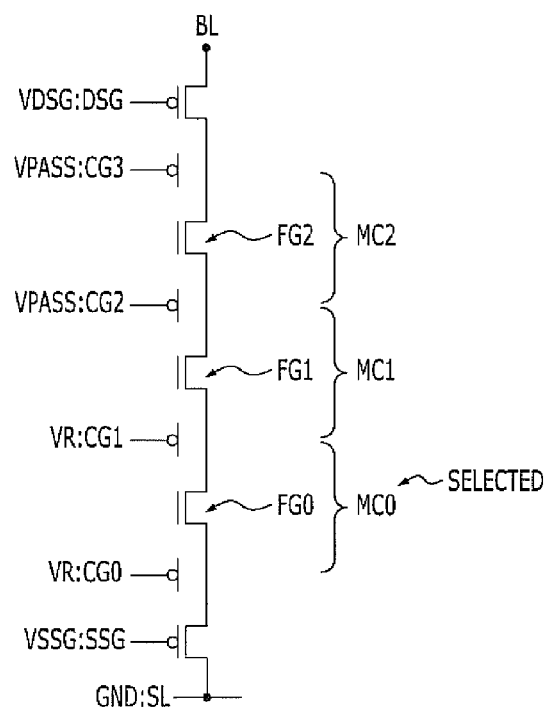

FIGS. 5A to 5H illustrate a conventional read operation. FIGS. 5A to 5C illustrate the condition of a voltage applied during the conventional read operation, and FIGS. 5D to 5H illustrate charges accumulated in a floating gate of a selected memory cell or the adjacent memory cells thereof during the conventional read operation. For illustration purposes, one string including the selected memory cell is illustrated in the drawings, and an example where one string includes three memory cells MC0 to MC2 is shown.

FIGS. 5A, 5B and 5C respectively show an example where the selected memory cell is a third memory cell MC2, an example where the selected memory cell is a second memory cell MC1, and an example where the selected memory cell is a first memory cell MC0.

The conventional reading method includes: applying a pass voltage to a drain selection gate DSG and a source selection gate SSG while a bit line BL is pre-charged, applying a ground voltage to a source line SL, applying a read voltage VR to the two control gates CG of a selected memory cell MC, and applying a pass voltage VPASS to the other control gates CG. Therefore, in the example of FIG. 5A, the read voltage VR is applied to the control gates CG3 and CG2 of the third memory cell MC2, and the pass voltage VPASS is applied to the other control gates CG1 and CG0. In the example of FIG. 5B, the read voltage VR is applied to the control gates CG2 and CG1 of the second memory cell MC1, and the pass voltage VPASS is applied to the other control gates CG0 and CG3. In the example of FIG. 5C, the read voltage VR is applied to the control gates CG0 and CG1 of the first memory cell MC0, and the pass voltage VPASS is applied to the other control gates CG2 and CG3.

In the conventional reading method, the read voltage VR may be a ground voltage GND or a low voltage close to the ground voltage GND, and the pass voltage VPASS is a voltage that is higher than the read voltage VR that turns on a memory cell. For example, the pass voltage VPASS may be approximately 5V.

In order to detect issues during the read operation, a read operation is observed while maintaining the charges accumulated in the floating gates FG0 and FG2 at the level of approximately '0' and varying the charges accumulated in the floating gate FG1. As a result of the observation, it is experimentally confirmed that the read characteristics of a non-volatile memory device had features according to the charges accumulated in the floating gate FG1. In the read operation, the charges accumulated in a floating gate may be in diverse states according to a program operation that is performed before a read operation.

In the examples of FIG. 5A or 5C, since the floating gate FG2 or FG0 of the selected memory cell MC2 or MC0 is in a state where the charges accumulated in the floating gate FG2 or FG0 is approximately '0', that is, an erase state, the threshold voltage of the selected memory cell MC2 or MC0 is to be kept lower than 0V.

Figure 5D:
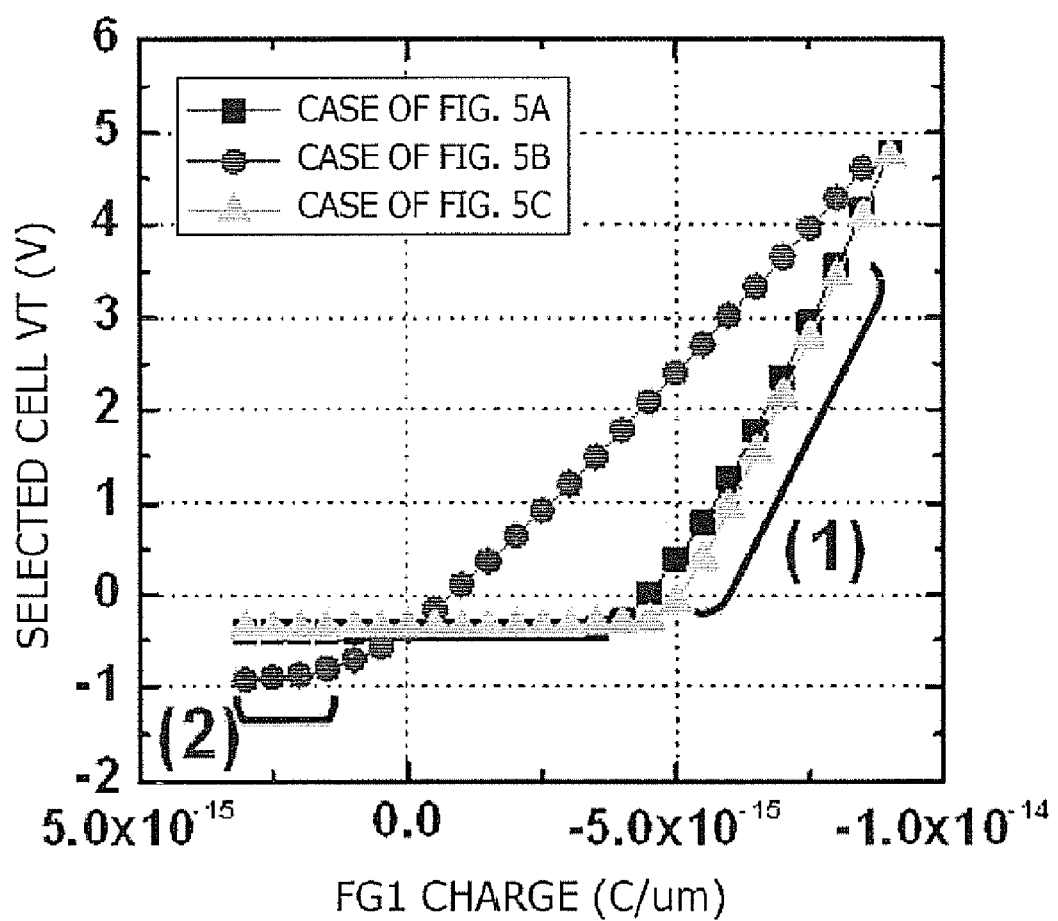

Referring to FIG. 5D, when an amount of negative charges accumulated in the floating gate FG1 of the adjacent memory cell MC1 is increased higher than a designated level, the threshold voltage of the selected memory cell MC2 or MC0 is dramatically increased to make a read operation performed abnormally (refer to (1)). The read operation is performed abnormally because of the influence of the adjacent floating gate FG1. The voltage level of the floating gate FG1 is decreased to turn off a corresponding channel, which is described in more detail below with reference to FIGS. 5E and 5F.

Figure 5E:
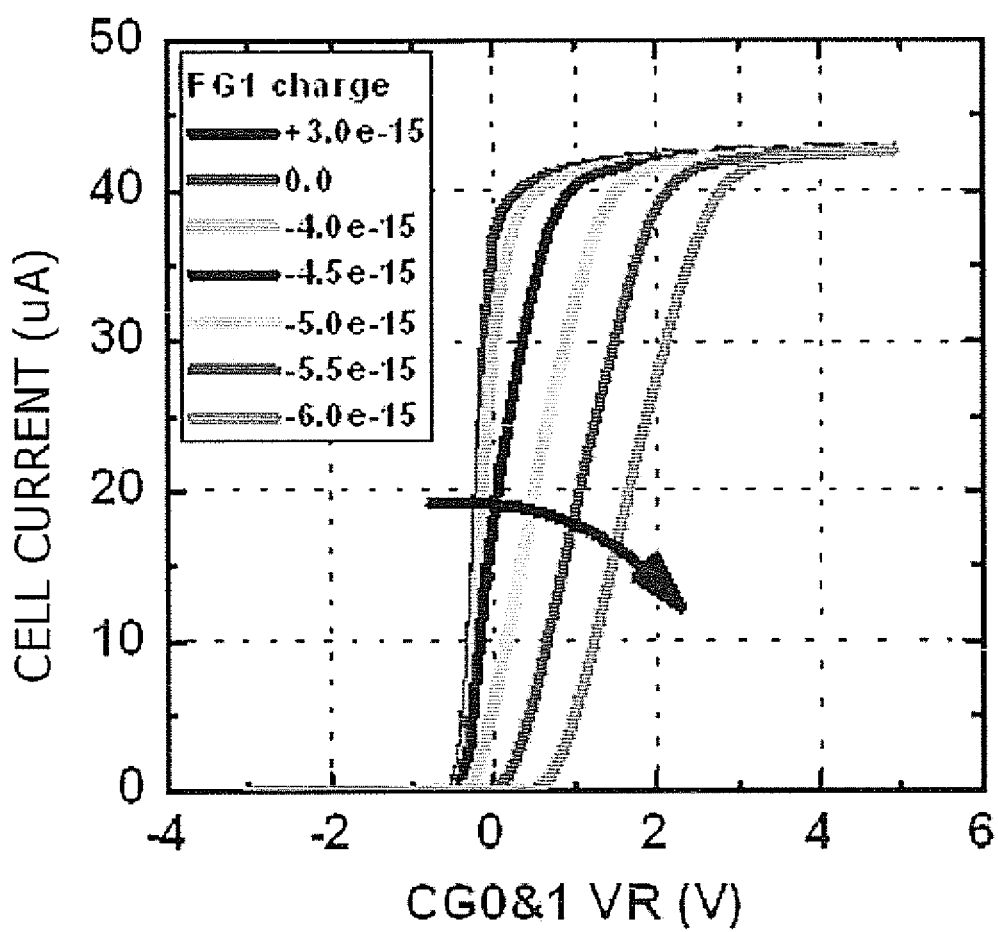

FIG. 5E is a current (I)-voltage (V) characteristics curve of a memory cell MC0 showing a cell current change according to the variation of the read voltage VR applied to the control gates CG0 and CG1 of the memory cell MC0. Since there is no change in the charges of the floating gate FG0 of the memory cell MC0, the current (I)-voltage (V) characteristics curve of the memory cell MC0 also has to have no change. However, as the charges accumulated in the floating gate FG1 of the adjacent memory cell MC1 is increased in a negative direction, FIG. 5E illustrates that the current (I)-voltage (V) characteristics curve of the selected memory cell MC0 moves toward a positive direction and the slope of a linear region is decreased, and more specifically, channel resistance is increased. In summary, the threshold voltage of the selected memory cell MC0, which should not be changed, moves according to the negative charges accumulated in the floating gate FG1 of the adjacent memory cell MC1.

Figure 5F:
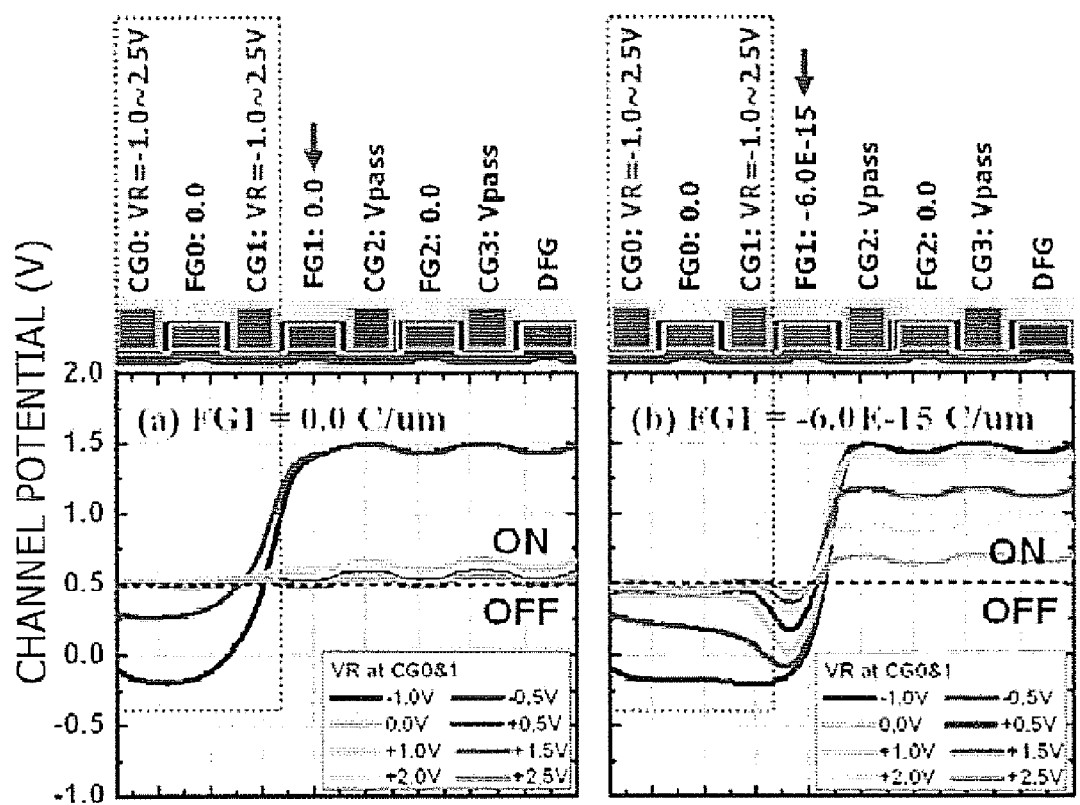

Referring to FIG. 5F, when the charges accumulated in the floating gate FG1 of the adjacent memory cell MC1 is 0 (refer to the left graph), a read operation for the selected memory cell MC0 may be normally performed. Alternatively, when negative charges are accumulated in the floating gate FG1 of the adjacent memory cell MC1 (refer to the right graph), the voltage level of the floating gate FG1 decreases to turn off a corresponding channel, which signifies that a read operation may not be normally performed for the selected memory cell MC0.

Therefore, the threshold voltage of the selected memory cell moves due to the influence of the negative charges accumulated in the floating gate of the memory cell disposed adjacent to the selected memory cell.

Meanwhile, in the case of FIG. 5B where charges are accumulated in the floating gate FG1 of the selected memory cell MC1, the threshold voltage of the selected memory cell MC1 changes according to the amount of charges accumulated in the floating gate FG1 during the read operation onto the selected memory cell MC1. More specifically, as the amount of the negative charges accumulated in the floating gate FG1 of the selected memory cell MC1 increases, the threshold voltage of the selected memory cell MC1 is increased during a read operation. As the amount of the negative charges accumulated in the floating gate FG1 of the selected memory cell MC1 is decreased, the threshold voltage of the selected memory cell MC1 is decreased during a read operation.

Referring back to FIG. 5D, from the point in time when the charges accumulated in the floating gate FG1 of the selected memory cell MC1 is higher than a designated voltage level in a positive direction, the decrease extent of the threshold voltage of the selected memory cell MC1 decreases and furthermore, saturation where the threshold voltage is not decreased any more may be achieved (refer to (2)). This is due to the influence of the control gates CG1 and CG2 of the selected memory cell MC1, and this occurs because the control gates CG1 and CG2 are so close to the channel that the channel is turned off. This is described below in detail with reference to FIGS. 5G and 5H.

Figure 5G:
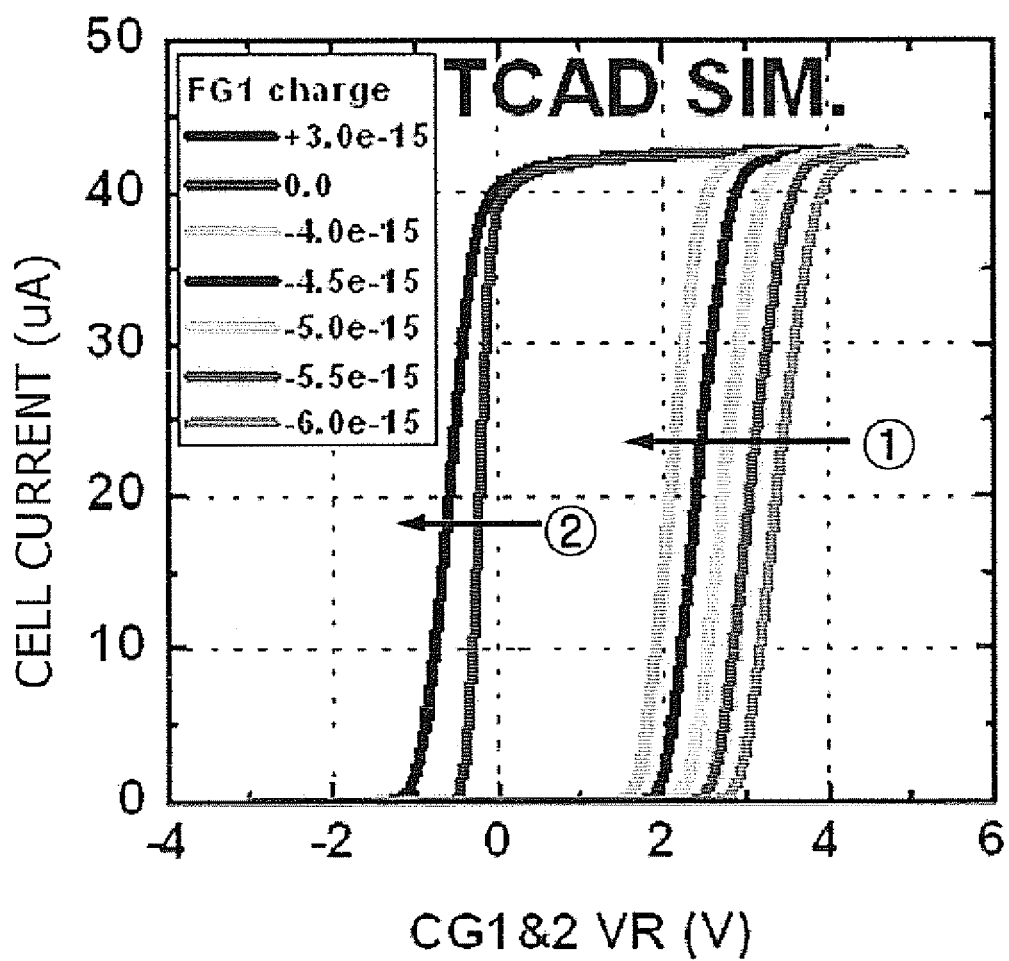

FIG. 5G is a current (I)-voltage (V) characteristics curve of a memory cell MC1 showing a cell current change according to the variation of the read voltage VR applied to the control gates CG1 and CG2 of the memory cell MC1. Generally, the current (I)-voltage (V) characteristics curve of the memory cell MC1 moves in proportion to the amount of charges accumulated in the floating gate FG1 of the selected memory cell MC1. In other words, the threshold voltage is changed. When the negative charges are accumulated in the floating gate FG1 of the selected memory cell MC1 and the amount of the accumulated negative charges changes, the threshold voltage of the memory cell MC1 is changed in proportion to the amount of the negative charges according to the general characteristics mentioned earlier (refer to an arrow $\hat{1}$). However, when positive charges are accumulated in the floating gate FG1 of the selected memory cell MC1 and the amount of the accumulated positive charges changes, the threshold voltage of the selected memory cell MC1 is not changed in proportion to the amount of the positive charges (refer to an arrow $\hat{2}$), which is different from the aforementioned general characteristics, and saturation is achieved. As shown in FIG. 5G, the slope of the current (I)-voltage (V) characteristics curve of the selected memory cell MC1 decreases, more specifically, the channel resistance is increased. After all, if the positive charges are accumulated in the floating gate FG1 of the selected memory cell MC1 and the amount of the accumulated positive charges is changed, the threshold voltage to the floating gates FG1 is no longer linear.

Figure 5H:
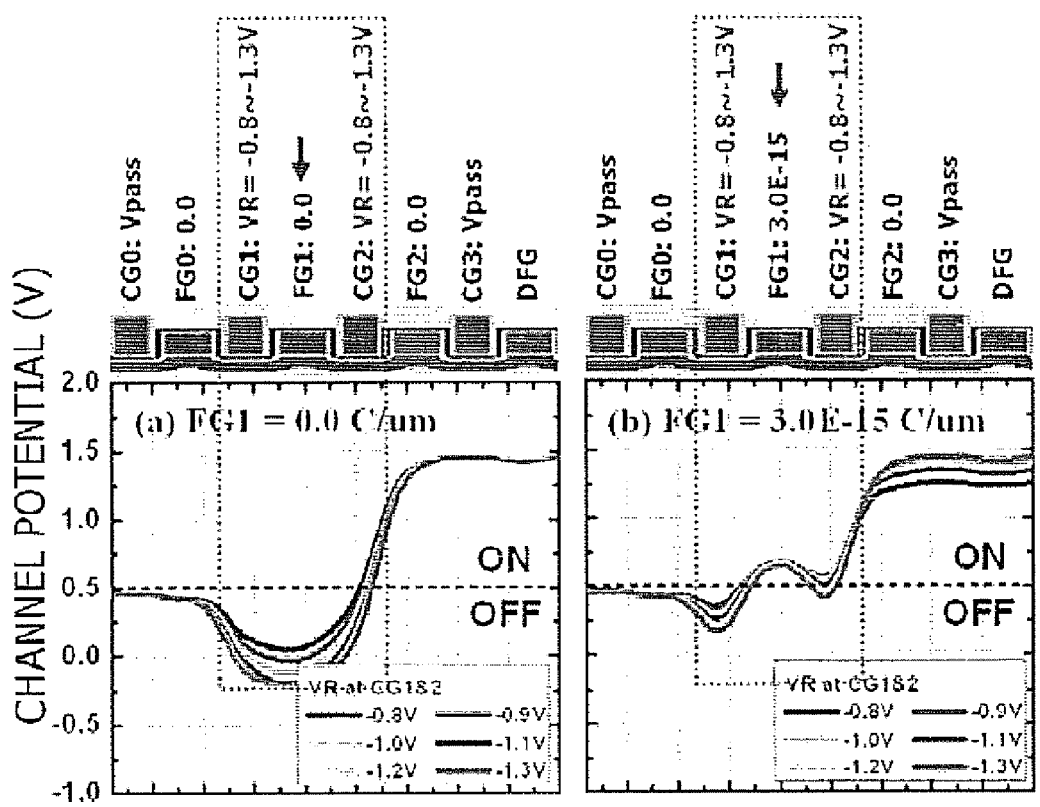

Referring to FIG. 5H, when the charges accumulated in the floating gate FG1 of the adjacent memory cell MC1 is 0 (refer to the left graph), the floating gates FG1 of the selected memory cell MC1 turns off a corresponding channel. Alternatively, when positive charges are accumulated in the floating gate FG1 of the selected memory cell MC1 (refer to the right graph), the control gates CG1 and CG2 of the selected memory cell MC1 turns off the corresponding channel.

Described hereafter is the condition of voltage during a read operation that may address the issues of the threshold voltage of a selected memory cell moving due to the influence of negative charges accumulated in the floating gate of an memory cell disposed adjacent to a selected memory cell. This voltage condition may be extracted from the following model.

Figure 6:
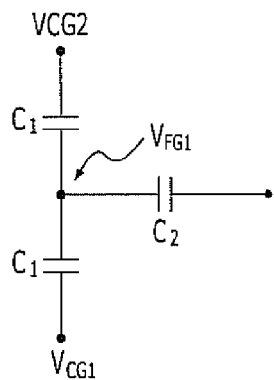
FIG. 6 illustrates an equivalent circuit of a unit memory cell shown in FIGS. 5A to 5C.

FIG. 6 illustrates an equivalent circuit of a unit memory cell shown in FIGS. 5A to 5C. In particular, FIG. 6 exemplarily shows the equivalent circuit of a memory cell MC1.

Referring to FIG. 6, the memory cell MC1 may be represented by a first capacitance C1 and a second capacitance C2. The first capacitance C1 represents the capacitance between the control gates CG1 and CG2 of the memory cell MC1 and the floating gate FG1, and the second capacitance C2 represents the capacitance between the floating gate FG1 of the memory cell MC1 and the channel. For example, the voltage level $V_{FG1}$ of the floating gate FG1 may be represented by the following Equation 1.

$$V_{FG1} = a\left(\frac{V_{CG1} + V_{CG2}}{2} - \Delta V_T\right) \quad \text{Equation 1}$$

Where $V_{CG1}$ and $V_{CG2}$ denote a voltage applied to the control gate CG1 and a voltage applied to the control gate CG2, respectively; a denotes a coupling ratio calculated by the following Equation 2; and $\Delta V_T$ denotes a value calculated by the following Equation 3, particularly, a value decided by the amount $\sigma_{FG1}$ of charges accumulated in the floating gate FG1.

$$a = \frac{2C_1}{2C_1 + C_2} \quad \text{Equation 2}$$

$$\Delta V_T = \frac{\sigma_{FG1}}{2C_1} \quad \text{Equation 3}$$

The voltage level of the floating gate FG1 of a second memory cell MC1 adjacent to the first memory cell MC0 during a read operation performed onto the first memory cell MC0 may be calculated as the following Equation 4 using the results of Equations 1 to 3. $V_{CG1}$ and $V_{CG2}$ are substituted with the read voltage VR and pass voltage VPASS.

$$V_{FG1} = a\left(\frac{VR + VPASS}{2} - \Delta V_T\right) \quad \text{Equation 4}$$

Since the read voltage VR has a designated value for the read operation, the decrease in the voltage level $V_{FG1}$ of the floating gate FG1 originating from the $\Delta V_T$ is compensated for by increasing the pass voltage VPASS applied to the control gate CG2 adjacent to the control gates CG0 and CG1 of the selected memory cell MC0. This increase in the pass voltage VPASS is because, as described above, when the voltage level of the floating gate FG1 is decreased, the corresponding channel is turned off and the read operation may not be normally performed. The increase amount ΔVPASS in the pass voltage VPASS may be calculated by Equation 5 in proportion to the amount of the negative charges accumulated in the floating gate FG1.

$$\Delta VPASS = 2\Delta V_T = -\frac{\sigma_{FG1}}{C_1} \quad \text{Equation 5}$$

In consequence, by increasing the pass voltage VPASS applied to the control gate CG2 adjacent to the control gates CG0 and CG1 of the selected memory cell MC0, the above described features may be addressed. These results may be confirmed experimentally as shown in FIGS. 7A and 7B.

Figure 7A:
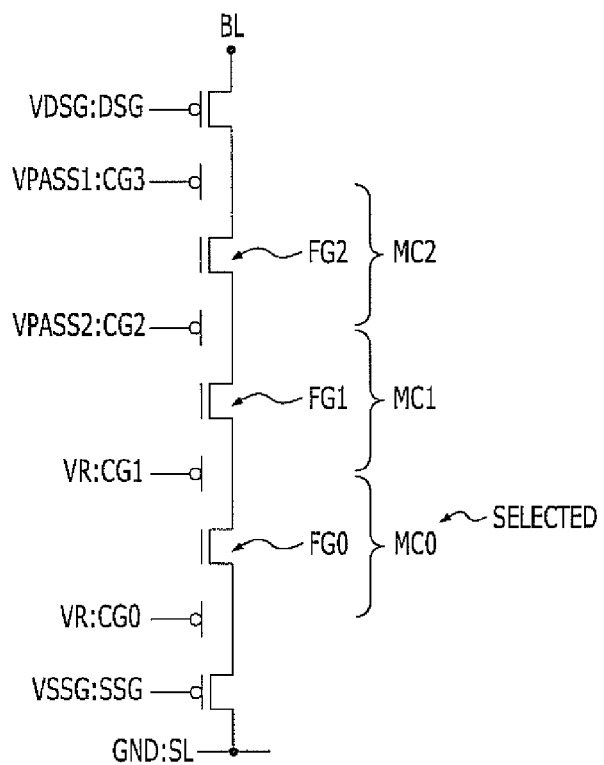
FIG. 7A shows a condition of a voltage applied during a read operation in accordance with an embodiment of the present invention.

FIG. 7A shows a condition of a voltage applied during a read operation in accordance with an embodiment of the present invention. FIG. 7B is a graph showing the result of FIG. 7A.

Referring to FIG. 7A, the same voltages as the voltages used during the conventional read operation are applied except the control gate CG2 adjacent to the control gates CG0 and CG1 of the selected memory cell MC0. In other words, the read voltage VR is applied to the control gates CG0 and CG1 of the selected memory cell MC0, and a first pass voltage VPASS1, which is the same voltage as the conventional pass voltage, e.g., approximately 5V, is applied to the other control gate CG3. However, a second pass voltage VPASS2, which is higher than the first pass voltage VPASS1, is applied to the control gate CG2. Although the second pass voltage VPASS2 is higher than the first pass voltage VPASS1, of the second pass voltage VPASS2 is a pass voltage that transfers a voltage for the formation of a channel. Therefore, the second pass voltage VPASS2 has a positive voltage value that is lower than a program voltage applied to the control gate of a selected memory cell to write a data in the selected memory cell.

Figure 7B:
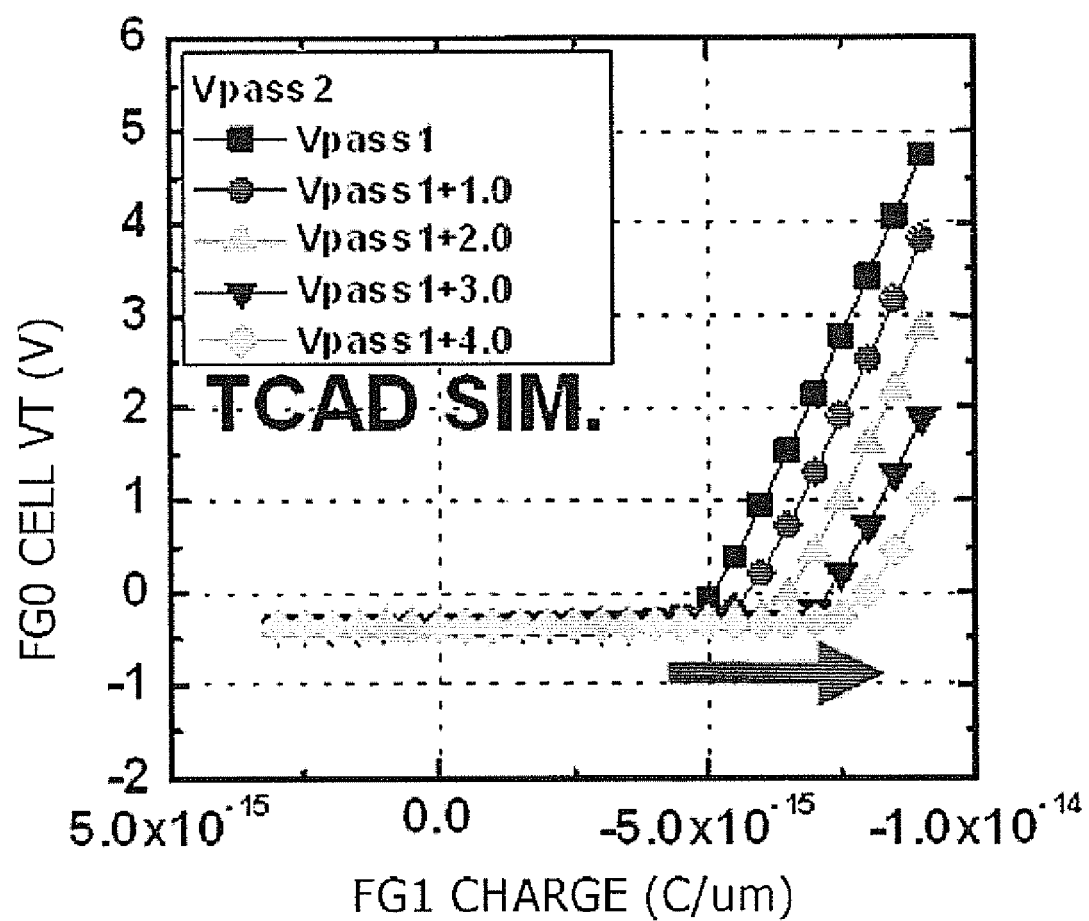
FIG. 7B is a graph showing the result of FIG. 7A.

Referring to FIG. 7B, as the size of the second pass voltage VPASS2 increases, the corresponding graph moves to the right. These results signify that as the second pass voltage VPASS2 applied to the control gate CG2 of the adjacent memory cell MC1 is increased, the influence of the negative charges accumulated in the floating gate FG1 of the adjacent memory cell MC1 is decreased and thus the threshold voltage of the selected memory cell MC0 is less. As the amount of the negative charges accumulated in the floating gate FG1 of the adjacent memory cell MC1 increases, the second pass voltage VPASS2 is increased to decrease the influence of the negative charges accumulated in the floating gate FG1.

The above embodiment shows an example where the control gate CG2 exists only on one side of the control gate CG1 because the selected memory cell MC0 is a memory cell in the lowermost part of a cell array. If there are adjacent memory cells on both sides of the selected memory cell, the higher second pass voltage VPASS2 may be applied to a control gate (not shown) disposed adjacent to the control gate CG0.

The present invention decreases the influence of the negative charges accumulated in a floating gate of the adjacent memory cell to a selected memory cell by increasing the pass voltage applied to a control gate disposed adjacent to a control gate of the selected memory cell. The first pass voltage, which is not increased, is applied to the other control gates except the control gate disposed adjacent to the control gate of the selected memory cell.

Meanwhile, all of the unselected memory cells have to be maintained as pass transistors even in a read operation that satisfies the above condition. To this end, the floating gates of the unselected memory cells have to have a voltage level that turns on the channels. Furthermore, the voltage levels of the floating gates are to be maintained uniformly. This is described in detail hereafter with reference to FIG. 8.

Figure 8:
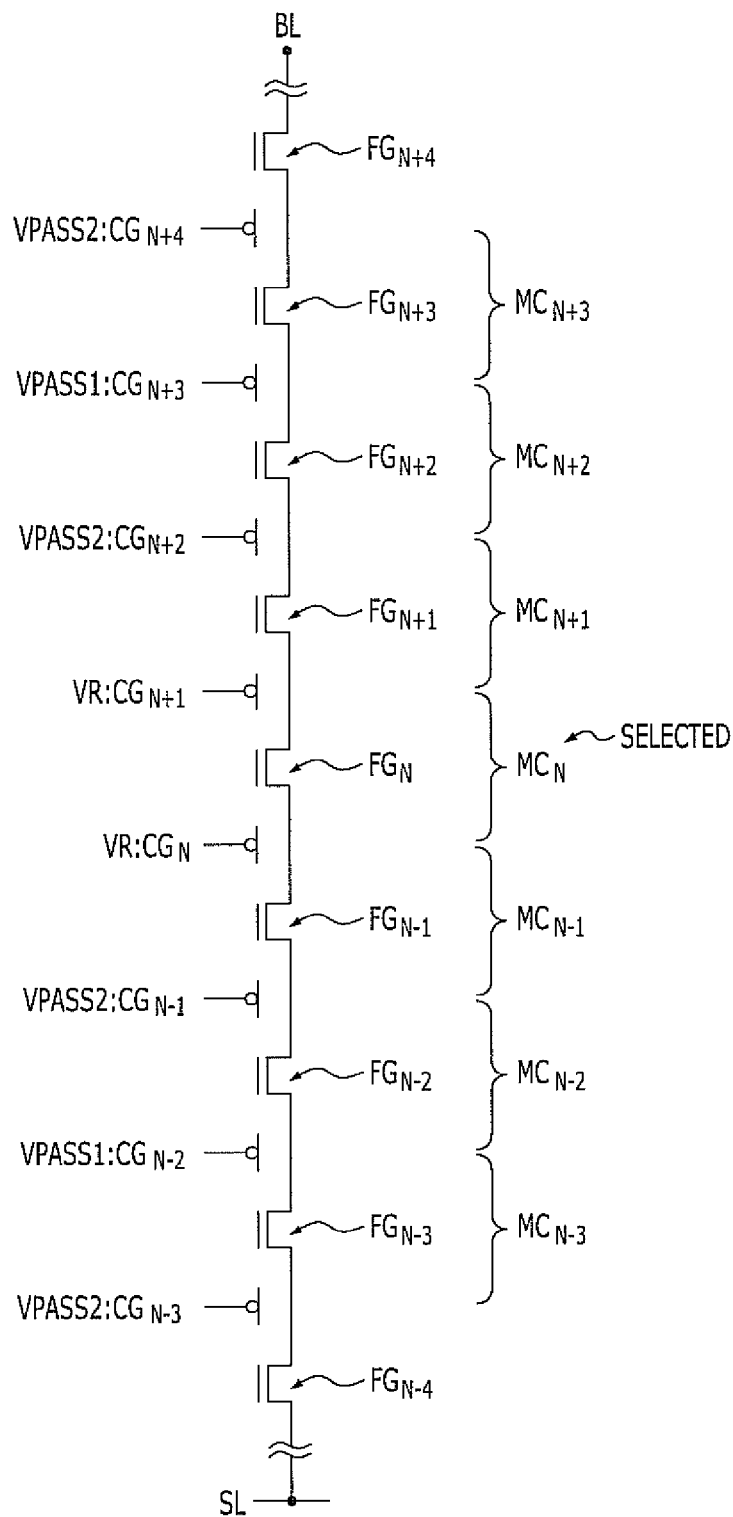
FIG. 8 shows a condition of a voltage applied during a read operation in accordance with another embodiment of the present invention.

FIG. 8 shows a condition of a voltage applied during a read operation in accordance with another embodiment of the present invention.

Referring to FIG. 8, while a bit line BL is pre-charged, a pass voltage is applied to a drain selection gate and a source selection gate, which are not illustrated in the drawing, a ground voltage is applied to a source line SL, and a read voltage VR is applied to the two control gates $CG_N$ and $CG_{N+1}$ of a selected memory cell $MC_N$. Also, as described before, a second pass voltage VPASS2, which is higher than a conventional pass voltage, is applied to the control gates $CG_{N-1}$ and $CG_{N+2}$ that are disposed adjacent to the control gates $CG_N$ and $CG_{N+1}$ of the selected memory cell $MC_N$. As described above, the conventional pass voltage may be, for example, about 5V.

Since the second pass voltage VPASS2, which is higher than the conventional pass voltage, is applied to the control gates $CG_{N-1}$ and $CG_{N+2}$, a first pass voltage VPASS1, which is lower than the conventional pass voltage, is applied to the control gates $CG_{N-2}$ and $CG_{N+3}$ disposed adjacent to the control gates $CG_{N-1}$ and $CG_{N+2}$. When the pass voltage applied to the control gates $CG_{N-2}$ and $CG_{N+3}$ is maintained at a similar voltage level to the conventional pass voltage, although the second pass voltage VPASS2 is raised, the pass voltage applied to the unselected memory cells may be increased during a read operation. As the level of the second pass voltage VPASS2 is increased, the first pass voltage VPASS1 is to be decreased in inverse proportion to the increasing second pass voltage VPASS2.

However, when the decreased first pass voltage VPASS1 is applied to the control gates $CG_{N-2}$ and $CG_{N+3}$, the increased second pass voltage VPASS2 has to be applied again to the control gates $CG_{N-3}$ and $CG_{N+4}$ disposed adjacent to the control gates $CG_{N-2}$ and $CG_{N+3}$ to maintain the voltage level of the floating gates of the unselected memory cells at a uniform level. This scheme is repeated throughout each memory string.

Consequently, in response to the control gates $CG_N$ and $CG_{N+1}$ of a selected memory cell $MC_N$, the relatively higher second pass voltage VPASS2 is applied to the control gates $CG_{N-1}$, $CG_{N-3}$, . . . and $CG_{N+2}$, $CG_{N+4}$, . . . that are disposed at the odd-number positions, and a relatively lower first pass voltage VPASS1 is applied to the control gates $CG_{N-2}$, $CG_{N-4}$, . . . and $CG_{N+3}$, $CG_{N+5}$, . . . that are disposed at the even-number positions. As a result, a voltage is applied in the shape of undulation.

Furthermore, the first pass voltage VPASS1 may be the same as the read voltage VR. If the first pass voltage VPASS1 is different from the read voltage VR, the voltage levels of the floating gates $FG_{N-1}$ and $FG_{N+1}$ of the memory cells $MC_{N-1}$ and $MC_{N+1}$ disposed adjacent to the selected memory cell $MC_N$ may be different from the voltage levels of the floating gates of the other unselected memory cells. This different voltage levels of the floating gates is because the control gates $CG_N$ and $CG_{N+1}$ of the memory cells $MC_{N-1}$ and $MC_{N+1}$ are shared by the selected memory cell $MC_N$ and the read voltage VR is applied thereto. However, when the first pass voltage VPASS1 is the same as the read voltage VR, the voltage levels of the floating gates of all the unselected memory cells including the memory cells $MC_{N-1}$ and $MC_{N+1}$ disposed adjacent to the selected memory cell $MC_N$ may be maintained at a uniform level.

When the read voltage VR is too low, e.g., approximately 0V, and the first pass voltage VPASS1 is made the same as the read voltage VR, the control gates of the unselected memory cells turn off a channel (refer to (2) of FIG. 5D and FIGS. 5G and 5H, and a normal read operation may not be performed. Therefore, when the threshold value of the read voltage VR is smaller than a value, which is so low that the channel of the control gates is turned off, a slightly higher voltage than the read voltage VR, e.g., approximately 1V, may be used as the first pass voltage VPASS1, instead of making the first pass voltage VPASS1 the same as the read voltage VR.

Meanwhile, each of the memory cells of the non-volatile memory device of the present invention may have any one among a plurality of program states having different threshold voltage distributions. The read voltage applied to a corresponding memory cell becomes different according to the program state of the memory cell. In this embodiment of the present invention, the pass voltage is controlled along with the adjustment of the read voltage. This adjustment is described in detail hereafter with reference to FIGS. 9 and 10.

Figure 9:
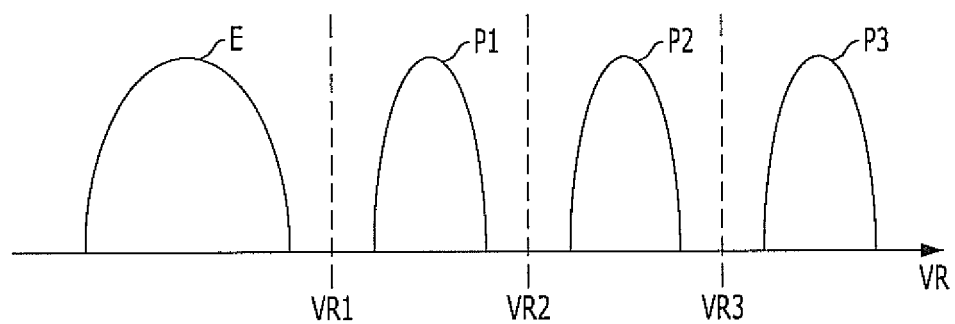
FIG. 9 illustrates the difference of read voltages according to the program state of a memory cell in a read operation in accordance with yet another embodiment of the present invention.
Figure 10:
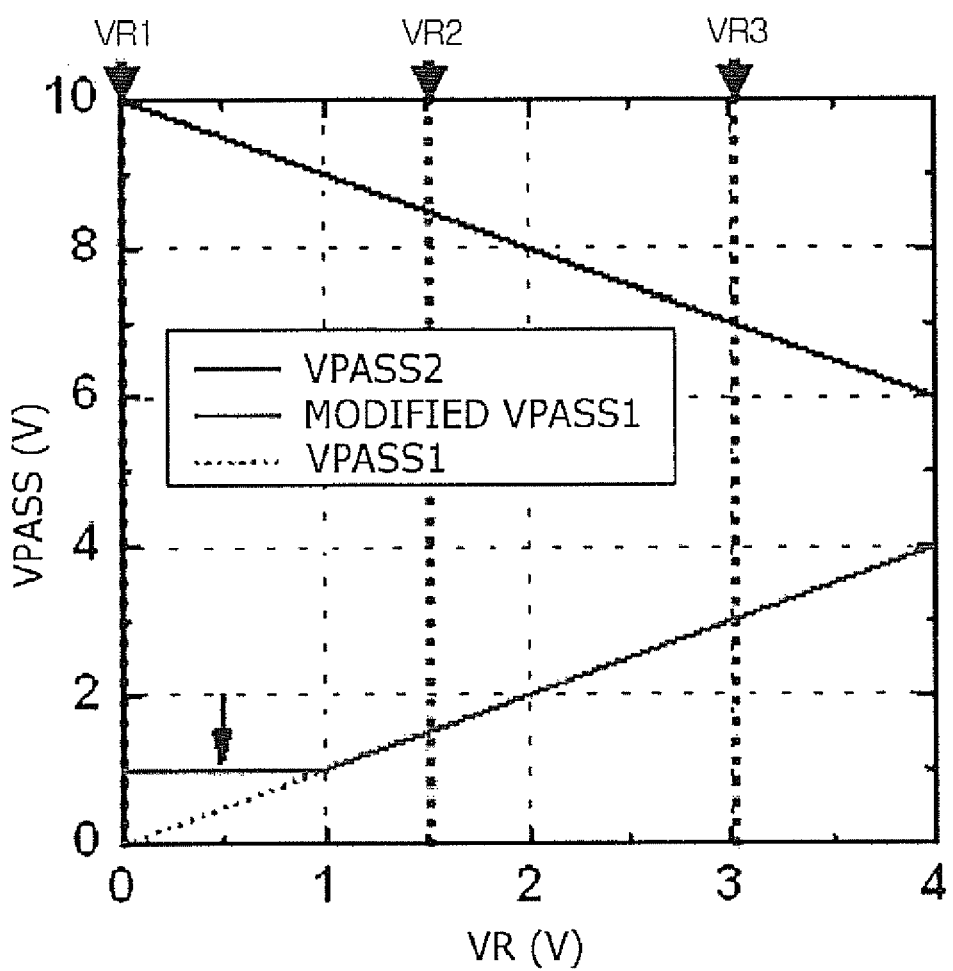
FIG. 10 illustrates the difference of pass voltages according to a change of a read voltage in a read operation in accordance with still another embodiment of the present invention.

FIG. 9 illustrates the difference of read voltages according to the program state of a memory cell in a read operation in accordance with yet another embodiment of the present invention. FIG. 10 illustrates the difference of pass voltages according to a change of a read voltage in a read operation in accordance with still another embodiment of the present invention.

Referring to FIG. 9, each of the memory cells may be in an erase state E where the memory cells are not programmed, or may have any one among first to third program states P1, P2, and P3, which have different threshold voltage distributions. The drawing exemplarily shows the memory cells may have any one among the three program states P1, P2 and P3, but the scope of the present invention are not limited three program states.

In the example shown in FIG. 9, a threshold voltage is increased from the first to third program states P1, P2 and P3. Therefore, to read a memory cell of the first program state P1, a first read voltage VR1 having a value between the threshold voltage of a memory cell in the erase state E and the threshold voltage of a memory cell in the first program state P1 is to be applied. Also, to read a memory cell of the second program state P2, a second read voltage VR2 having a value between the threshold voltage of a memory cell in the first program state P1 and the threshold voltage of a memory cell in the second program state P2 is to be applied. Also, to read a memory cell of the third program state P3, a third read voltage VR3 having a value between the threshold voltage of a memory cell in the second program state P2 and the threshold voltage of a memory cell in the third program state P3 is to be applied.

The pass voltage may be controlled in the non-volatile memory device in accordance with the embodiment of the present invention when the read voltage applied to the selected memory cell is changed. The controlling of the pass voltage as above is described hereafter with reference to FIGS. 8 and 10.

Referring to FIGS. 8 and 10, although the voltage level of the read voltage VR applied to the control gates $CG_N$ and $CG_{N+1}$ of the selected memory cell $MC_N$ is changed, the voltage levels of the floating gates $FG_{N-1}$ and $FG_{N+1}$ of the adjacent memory cells $MC_{N-1}$ and $MC_{N+1}$ are maintained at a uniform level to normally perform a read operation.

Therefore, the level of the second pass voltage VPASS2 is decreased as the read voltage VR is increased, and to maintain the sum of the read voltage VR and the second pass voltage VPASS2 at a uniform level. When a third read voltage VR3 of the highest level is applied, the second pass voltage VPASS2 is in its lowest voltage level.

Furthermore, the first pass voltage VPASS1 is in inverse proportion to the second pass voltage VPASS2. Therefore, when a first read voltage VR1 of the lowest level is applied, the first pass voltage VPASS1 is in its lowest voltage level. When the third read voltage VR3 of the highest level is applied, the second pass voltage VPASS2 is in its highest voltage level. In particular, since the first pass voltage VPASS1 may be the same as the read voltage VR, the first pass voltage VPASS1 may be the first read voltage VR1, the second read voltage VR2, or the third read voltage VR3.

When the read voltage VR is too low as described above, for example, approximately 0V, and the read voltage VR is lower than a threshold value, the first read voltage VR1 may not be decreased any more to prevent the aforementioned features, and accordingly, the first read voltage VR1 may be higher than the read voltage VR in a corresponding period of time (refer to an arrow in FIG. 10). Therefore, when the first read voltage VR1 of the lowest level is applied, the first pass voltage VPASS1 may be higher than the first read voltage VR1.

The conditions of the first pass voltage VPASS1 and the second pass voltage VPASS2 according to the above-described read voltage are exemplarily presented in the following Table 1.

TABLE 1

| control gate CG | VR1 applied | VR2 applied | VR3 applied |
|---|---|---|---|
| $CG_{N+4}$ | 10 V | 8.5 V | 7 V |
| $CG_{N+3}$ | 1 V | 1.5 V | 3 V |
| $CG_{N+2}$ | 10 V | 8.5 V | 7 V |
| $CG_{N+1}$ | 0 V | 1.5 V | 3 V |
| $CG_N$ | | | |
| $CG_{N+1}$ | 10 V | 8.5 V | 7 V |
| $CG_{N+2}$ | 1 V | 1.5 V | 3 V |
| $CG_{N+3}$ | 10 V | 8.5 V | 7 V |

As shown in Table 1, when the read voltage VR of 0V, 1.5V or 3V is applied to the control gates $CG_N$ and $CG_{N+1}$ of the selected memory cell $MC_N$, the second pass voltage VPASS2 of 10V, 8.5V or 7V is applied. In short, the sum of the read voltage VR and the second pass voltage VPASS2 is maintained uniformly. Also, the first pass voltage VPASS1 is the same as the read voltage VR, except when the read voltage VR is as low as 0V, the first pass voltage VPASS1 may be higher than the read voltage VR, which is 1V.

However, the scope of the present invention is not limited to the figures in Table 1, and the present invention may include diverse modifications.

Furthermore, the present invention is not limited to a case where each of the memory cells is programmed into any one of the first to third program states P1, P2 and P3, and the present invention may be applied to a case where each memory cell is programmed to any one among N program states.

More specifically, when it is assumed that each of the memory cells is programmed into the erase state E or any one of first to $N^{th}$ program states, where N is a natural number greater than 2, in a direction where the threshold voltage is increased and the read voltage VR for reading the memory cell that is programmed into any one of the first to $N^{th}$ program states is any one of VR1, VR2, ..., VRN that are arrayed in a direction where the voltage level is increased, the voltage level of the second pass voltage VPASS2 is decreased as the read voltage VR goes from VR1 toward VR2, VR3, ..., VRN and the sum of the read voltage VR and the second pass voltage VPASS2 may be uniform. The first pass voltage VPASS1 may be the same as the VR2, VR3, ..., VRN, and it may be the same as the VR1 or higher than the VR1.

To sum up, the technology of the present invention is directed to decreasing the influence of the charges implanted into the floating gates of adjacent memory cells by applying a second pass voltage to the adjacent control gates when a read voltage is applied to the control gates of a selected memory cell. Furthermore, the technology of the present invention is directed to uniformly maintaining the voltage level of the floating gates of unselected memory cells by alternately applying the second pass voltage and a first pass voltage, which is lower than the second pass voltage, to the control gates of the unselected memory cells, particularly, by applying the first pass voltage, which is the same as the read voltage. Also, when the selected memory cell has a plurality of program states, the voltage level of the floating gates of the unselected memory cells are maintained uniformly despite a change in the read voltage by interlocking the first pass voltage with the read voltage and controlling the second pass voltage to be a value that is in reverse proportion to the read voltage. If the read voltage is low, the first pass voltage may have a lower limit.

According to an embodiment of the present invention, a read operation of a non-volatile memory device has a structure where a control gate is shared by adjacent memory cells and detects and addresses an issue occurring during a read operation.

While the present invention has been described with respect to the specific embodiments, it will be apparent to those skilled in the art that various changes and modifications may be made without departing from the spirit and scope of the invention as defined in the following claims.

What is claimed is:

1. A reading method of a non-volatile memory device that includes a plurality memory cells that each include one floating gate and two control gates disposed adjacent to the floating gate on two alternate sides of the floating gate, respectively, and two adjacent memory cells share one control gate, the reading method comprising:

applying a read voltage to control gates of a selected memory cell;

applying a second pass voltage to alternate control gates of the memory cells different from the control gates of the selected memory cells starting from the control gates next to the selected memory cell; and applying a first pass voltage that is lower than the second pass voltage to alternate the control gates of the memory cells different from the control gates of the selected memory cells starting from the control gates secondly next to the selected memory cell.

2. The reading method of claim 1, wherein a voltage level of the second pass voltage is in proportion to an amount of negative charges accumulated in the floating gate of an adjacent memory cell to the selected memory cell.

3. The reading method of claim 1, wherein as the second pass voltage is increased, the first pass voltage is decreased.

4. The reading method of claim 1, wherein a voltage level of the first pass voltage is the same as a voltage level of the read voltage.

5. The reading method of claim 1, wherein when the read voltage is higher than a threshold value, the first pass voltage is the same as the read voltage, and when the read voltage is not higher than the threshold value, the first pass voltage is higher than the read voltage.

6. The reading method of claim 1, wherein the selected memory cell has one program state among a plurality of program states that have different threshold voltages from each other, the read voltage includes multiple levels of read voltage for reading the multiple program states, and the second pass voltage is increased as the level of the read voltage is decreased.

7. The reading method of claim 6, wherein a sum of the read voltage and the second pass voltage is uniform.

8. The reading method of claim 6, wherein the first pass voltage has the same voltage level of the read voltage.

9. The reading method of claim 6, wherein when the read voltage has a voltage level for reading memory cells except a memory cell having a program state of the lowest threshold voltage of the different threshold voltages, the voltage level of the first pass voltage is the same as the voltage level of the read voltage, and when the read voltage has a voltage level for reading the memory cell having the program state of the lowest threshold voltage, the voltage level of the first pass voltage is higher than the voltage level of the read voltage.

10. The reading method of claim 1, wherein a plurality of floating gates and a plurality of control gates are alternately stacked along a channel extending from a substrate.

11. The reading method of claim 10, wherein the channel includes a first channel and a second channel, and the first channel and the second channel are coupled with each other through a connection channel disposed under the first channel and the second channel.

12. A reading method of a non-volatile memory device that includes a plurality of memory cells that each include one floating gate and two control gates disposed adjacent to the floating gate on two alternate sides of the floating gate, respectively, and two adjacent memory cells share one control gate, the reading method comprising:

applying a read voltage to control gates of a selected memory cell;

applying a second pass voltage to a control gate disposed adjacent to the control gates of the selected memory cell; and applying a first pass voltage that is lower than the second pass voltage to the control gates that do not apply the second pass voltage.

13. The reading method of claim 12, wherein the voltage level of the second pass voltage is in proportion to an amount of negative charges accumulated in the floating gate of an adjacent memory cell to the selected memory cell.

14. The reading method of claim 12, wherein as the second pass voltage is increased, the first pass voltage is decreased.

15. The reading method of claim 12, wherein a voltage level of the first pass voltage is the same as a voltage level of the read voltage.

16. The reading method of claim 12, wherein when the read voltage is higher than a threshold value, the first pass voltage is the same as the read voltage, and when the read voltage is not higher than the threshold value, the first pass voltage is higher than the read voltage.

17. The reading method of claim 12, wherein the selected memory cell has one program state among a plurality of program states that have different threshold voltages from each other, the read voltage includes multiple levels of read voltage for reading the multiple program states, and the second pass voltage is increased as the voltage level of the read voltage is decreased.

18. The reading method of claim 17, wherein a sum of the read voltage and the second pass voltage is uniform.

19. The reading method of claim 17, wherein the first pass voltage has the same voltage level as the read voltage.

20. The reading method of claim 17, wherein when the read voltage has a voltage level for reading memory cells except a memory cell having a program state of the lowest threshold voltage of the different threshold voltages, the voltage level of the first pass voltage is the same as the voltage level of the read voltage, and when the read voltage has a voltage level for reading the memory cell having the program state of the lowest threshold voltage, the voltage level of the first pass voltage is higher than the voltage level of the read voltage.

* * * * *